(12) United States Patent
Zhou et al.

(10) Patent No.: US 8,203,337 B2
(45) Date of Patent: Jun. 19, 2012

(54) ELIMINATION OF ERRORS DUE TO AGING IN MAGNETO-RESISTIVE DEVICES

(75) Inventors: Yuchen Zhou, San Jose, CA (US); Grace Gorman, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 371 days.

(21) Appl. No.: 12/456,306

(22) Filed: Jun. 15, 2009

(65) Prior Publication Data

US 2010/0315928 A1  Dec. 16, 2010

(51) Int. Cl.
*G01R 33/06* (2006.01)
(52) U.S. Cl. ............... 324/252; 324/260; 324/117 R
(58) Field of Classification Search .......... 324/251–252, 324/260, 126, 117 R
See application file for complete search history.

(56) References Cited

U.S. PATENT DOCUMENTS

| | | | |
|---|---|---|---|
| 4,596,950 A * | 6/1986 | Lienhard et al. | 324/117 R |
| 6,580,271 B2 | 6/2003 | Li et al. | |
| 7,259,545 B2 | 8/2007 | Stauth et al. | |
| 7,440,861 B2 | 10/2008 | Ausserlechner et al. | |
| 2006/0170529 A1 | 8/2006 | Shoji | |
| 2007/0154740 A1 | 7/2007 | Yuasa et al. | |
| 2008/0186023 A1 * | 8/2008 | Biziere et al. | 324/252 |
| 2009/0128130 A1 * | 5/2009 | Stauth et al. | 324/117 R |

\* cited by examiner

*Primary Examiner* — Arleen M Vazquez
(74) *Attorney, Agent, or Firm* — Saile Ackerman LLC; Stephen B. Ackerman

(57) ABSTRACT

The problem of magneto-resistive sensor drift with age has been solved by normalizing the sensor's output relative to its output when it is in a selected reproducible state. Details for the method to accomplish this normalization are disclosed together with several examples of how the method can be utilized.

15 Claims, 4 Drawing Sheets

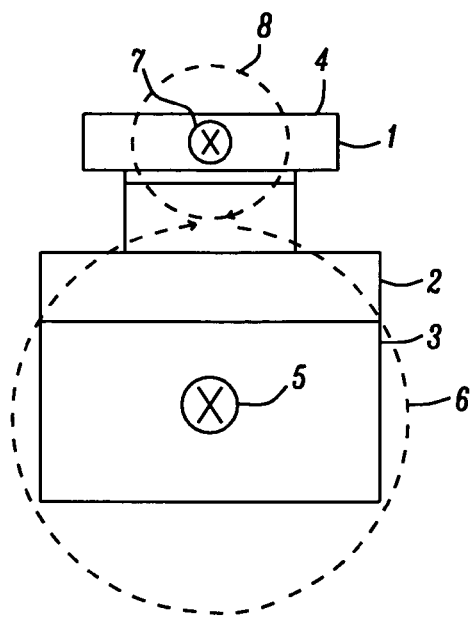
FIG. 1A – Prior Art
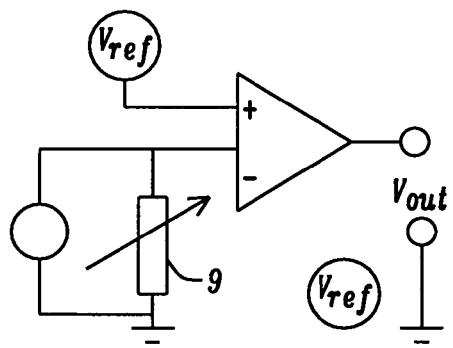
FIG. 1B – Prior Art
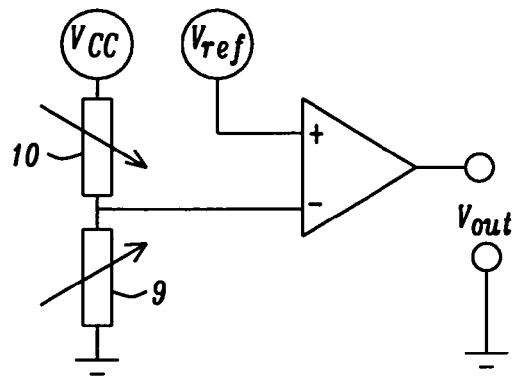
FIG. 1C – Prior Art

_US 8,203,337 B2_

ELIMINATION OF ERRORS DUE TO AGING IN MAGNETO-RESISTIVE DEVICES

FIELD OF THE INVENTION

The invention relates to the general field of magnetic measurements with particular reference to measuring magnetic field strength and correcting such measurements for the effects of sensor aging.

BACKGROUND OF THE INVENTION

Using magneto resistive (MR) sensors for magnetic field sensing as replacements for the Hall sensors currently being used in commercial products, has the advantage of much higher sensitivity. By using state-of-the-art magnetic tunnel junction (MTJ) sensors, sensitivities an order of magnitude greater than that of Hall sensors can be achieved.

The use of MR devices as current sensors in circuits to which they are not connected (by sensing the magnetic fields associated with these circuits) is disclosed in the Prior Art[1-2]. FIG. 1A shows the general structure of a closed-loop current field sensor. It has three key parts—MR sensor 1, current carrying electric line 3, and field-canceling electric line 4. The current in electric line 3, which is situated beneath the substrate 2 where the MR sensor sits, is the physical quantity to be measured by the MR sensor. When current 5 is flowing through line 3, it generates a magnetic field at MR sensor 1 as represented by the field line 6. This field will rotate the magnetization of the sensing layer of 1 which results in a resistance change across MR sensor 1.

During a closed-loop operation, a second current 7 runs through the field-cancelling line 4 adjacent to MR sensor 1 and produces a field 8 in MR sensor 1 which offsets field 6 in MR sensor 1 generated by current 5. When the field 8 generated by line 4 in sensor 1 has been calibrated, the current 7 that is required to completely offset the field 6 generated by 5 and produces an effective zero total field in MR sensor 1, i.e. brings the resistance of sensor 1 to its zero field value, serves as a measurement of the current value 5 running in line 3.

Two other prior art sensing schemes are illustrated in FIGS. 1B and FIG. 1C. FIG. 1B is an open-loop configuration wherein a current source powers MR sensor 9 and the voltage across the sensor is compared to a reference voltage $V_{ref}$ which is set to equal sensor voltage 9 in the absence of an external magnetic field. Thus, the output voltage $V_{out}$ is proportional to the resistance change of the sensor 9. If the sensor 9 resistance has a reasonably linear response to the external field, $V_{out}$ can then be a measurement of the external magnetic field that is being measured by sensor 9.

FIG. 1C shows another scheme, where two MR sensors, 9 and 10, that have similar resistance and sensitivity characteristics, are connected in serial and powered by voltage source $V_{CC}$. However, the MR sensors are arranged to be in opposition so that, when exposed to the same magnetic field, the resistance of one increases while that of the other sensor decreases.

Thus, for the FIG. 1C configuration, whenever there is a magnetic field present, the voltage at the connection point of the two MR sensors will deviate from $V_{CC}/2$. When $V_{ref}$ is set as $V_{CC}/2$, $V_{out}$ changes accordingly. The FIGS. 1B and 1C structures are generally applicable to field sensing applications but 1C and 1A can be readily combined whereby an accurate measurement of underlying electric current 5 is obtained from current value 7 when $V_{out}$ (of FIG. 1C) is offset to zero.

What limits the 1B and 1C circuits, as implemented in the prior art, is that these schemes use the resistance of the MR sensors directly. The FIG. 1B open-loop structure is sensitive to the absolute value of the resistance fluctuation, so resistance shifts during operation due, for example, to thermal, electrical or mechanical stresses, will directly affect the accuracy of the measurement.

The accuracy of the FIG. 1C scheme, though not affected by the absolute resistance shifts of the two MR sensors, is affected by relative resistance shifts between the two sensors, i.e. if the sensors' resistances do not change to the same degree when undergoing the same kind of stress.

FIG. 2 shows how the zero field resistance, $R_0$, of two MTJ devices can change over time when they are in power-on mode and exposed to a stress temperature that is significantly higher than room temperature. FIG. 2 shows that there is a general resistance increase of ~4.5% over the original zero field resistance as well as a difference in the magnitude of the resistance increase of ~1%. Because of this difference in resistance change between the two sensors, both the FIGS. 1B and 1C schemes will undergo some degradation of their measurement accuracy.

[1] J. Stauth, R. Dickinson, G. Forrest, and R. Vig, "Integrated Sensor," U.S. Pat. No. 7,259,545 B2 (2007)

[2] S. Shoji, "Current Sensor," US Patent Pub. #US 2006/0170529 A1 (2006)

A routine search of the prior art was performed with the following references of interest being found:

In U.S. Pat. No. 7,440,861, Ansserlechner et al. discuss the piezoelectric effect on magnetic field sensors and use temperature compensation to mitigate the effect. U.S. Pat. No. 6,580,271 (Li et al.) discloses applying a current to induce a known magnetic filed and then using a proportioning approach to determine the unknown magnetic field. U.S. Patent Application 2007/0154740 by Yuasa et al. is an example of a patent application using normalized resistance, but only to prepare a graph.

SUMMARY OF THE INVENTION

It has been an object of at least one embodiment of the present invention to reduce the impact on measurement accuracy of MR sensor resistance drift during life.

Another object of at least one embodiment of the present invention has been to provide an in-situ method to correct for said MR sensor resistance drift.

Still another object of at least one embodiment of the present invention has been to show how the invention may be used to improve the accuracy of remote current measurement methods.

A further object of at least one embodiment of the present invention has been to improve the accuracy of two-sensor field measurement methods.

These objects have been achieved by the disclosure of two methods to generate normalizing factors that may be applied to any magneto-resistive sensor for correcting changes to their outputs that have occurred as a result of aging (particularly after being subjected to stresses of one sort or another). Both methods depend on placing the sensor in a determined state. The latter is defined as any state of the sensor that is associated with the sensor being in a particular magnetic environment such as, for example, saturation.

In the first method, a baseline value for the sensor's resistance, while the sensor is in a determined state, is obtained and recorded. Then, when the sensor is to be used at some later time, an updated value of the sensor's resistance is obtained. This updated value is then divided by the baseline value to create a normalizing factor $R_2/R_1$ that is used to correct the value of the sensor's output voltage when it is measuring a magnetic field.

In the second method, voltage $V_1$ is applied to the sensor (which has resistance $R_1$ by virtue of being in a selected determined state) causing current $I_1$ to pass through it. Then, when the sensor is being used to measure a magnetic field, a current source is employed to enable current $I_1$ to continue to be driven through it, causing a voltage drop of (say) $V_2$ across the sensor. If the resistance of the sensor (in this particular magnetic field) is $R_2$, $V_2$ is then the normalized voltage relative to the selected determined state.

BRIEF DESCRIPTION OF THE DRAWINGS

FIGS. 1A, 1B, and 1C illustrate some prior art applications of MR sensors.

DESCRIPTION OF THE PREFERRED EMBODIMENTS

Figure 2:
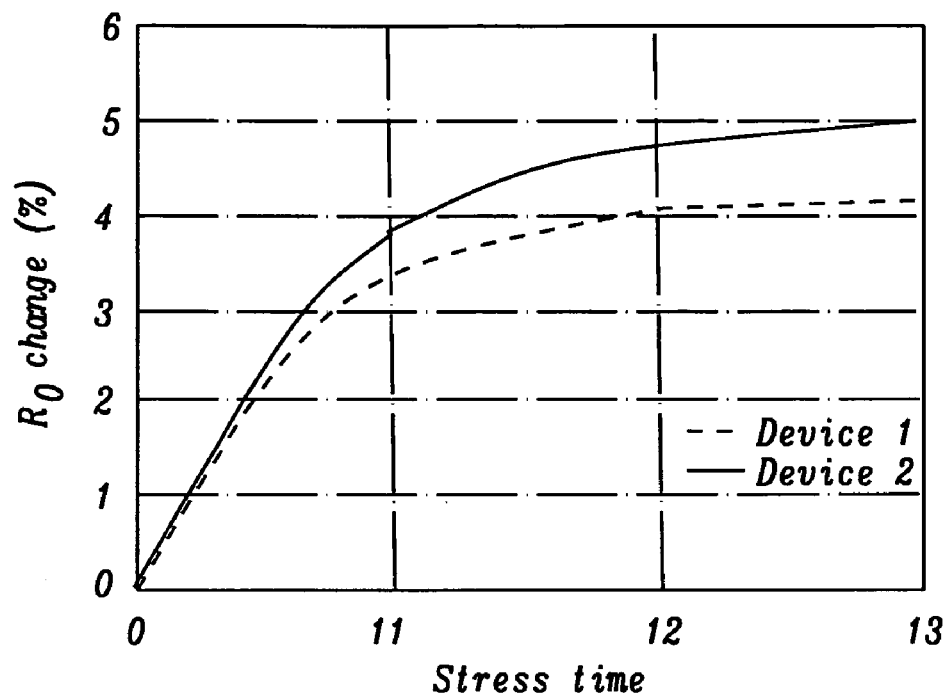
FIG. 2 shows how the resistance of an MR device may increase over time due to aging effects.
Figure 3A:
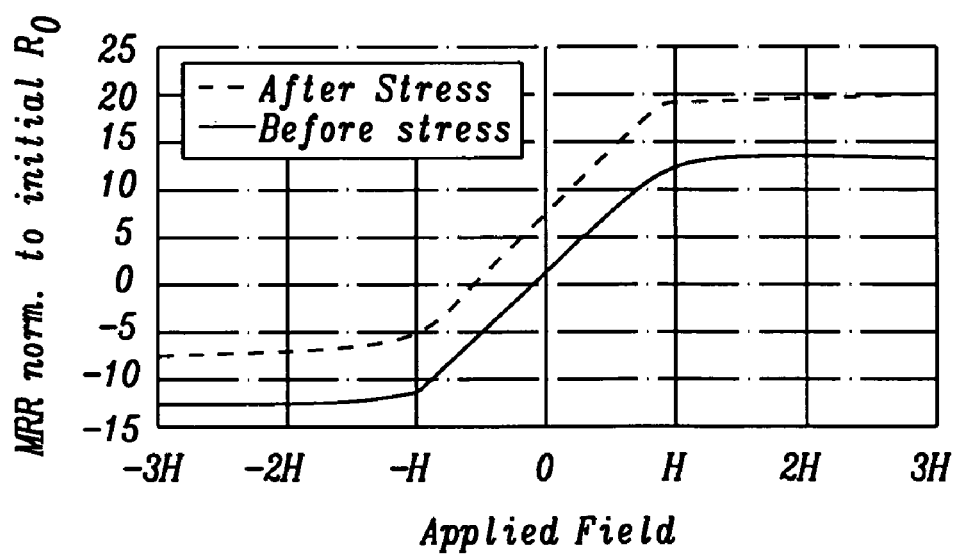
FIG. 3A illustrates the upward drift of an MR sensor resistance vs. applied field curve as the sensor ages.

FIG. 3A shows MR sensor resistance vs. applied field curves for a MTJ sensor. The sensor is exposed for an extended period to high temperature stress while in power-on mode. The dotted and solid curves represent the after and before stress measurement respectively. The shift of the dotted curve towards a higher resistance state relative to the solid curve reflects the same resistance increase at time t3 vs time 0 in FIG. 2. Such resistance increase causes inaccuracy in magnetic field sensing as stated above.

Figure 3B:
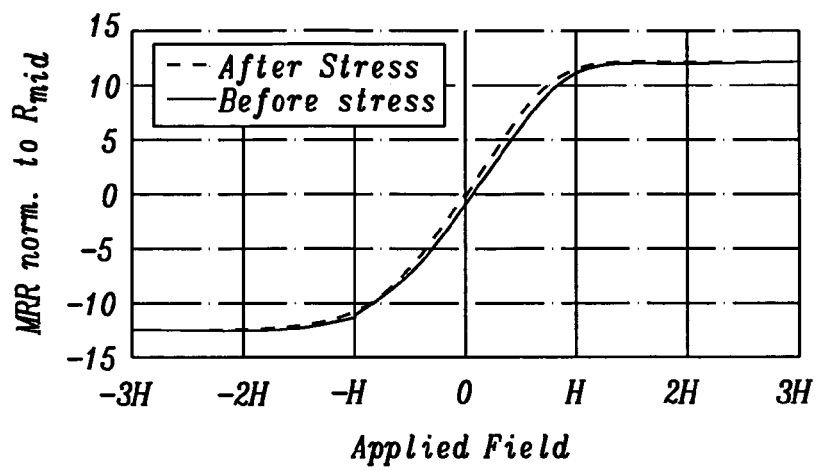
FIG. 3B shows how changes due to aging can be corrected through application of a normalizing factor.

FIG. 3B shows the same two curves when each has been normalized by its own resistance mean value, which is calculated by averaging the maximum and minimum resistance values from each of the curves at +3H and −3H fields (3H being sufficient to put the device into saturation i.e. into a reproducible state). The resulting curves as shown in FIG. 3B are almost exactly over-lapping and show insignificant relative vertical shift. Note that, although the sensor's baseline resistance has shifted, its sensitivity to the magnetic field (dR/R) remains the same.

It thus becomes a simple matter to determine a normalizing factor that offsets the amount by which any given sensor has drifted because of aging effects. In this way the resistance value provided by the sensor, in any given field at any stage of the sensor's life, can be normalized by this factor.

Experimental data have confirmed that the resistance of the sensor, when it is in one of several possible determined states, is a suitable parameter to use when computing such a normalization factor. We will discuss determined states further below but note here that the normalization factor will need to be updated each time a new set of field measurements is made (unless the sensor baseline resistance is known to not have changed since the last update).

Figure 4:
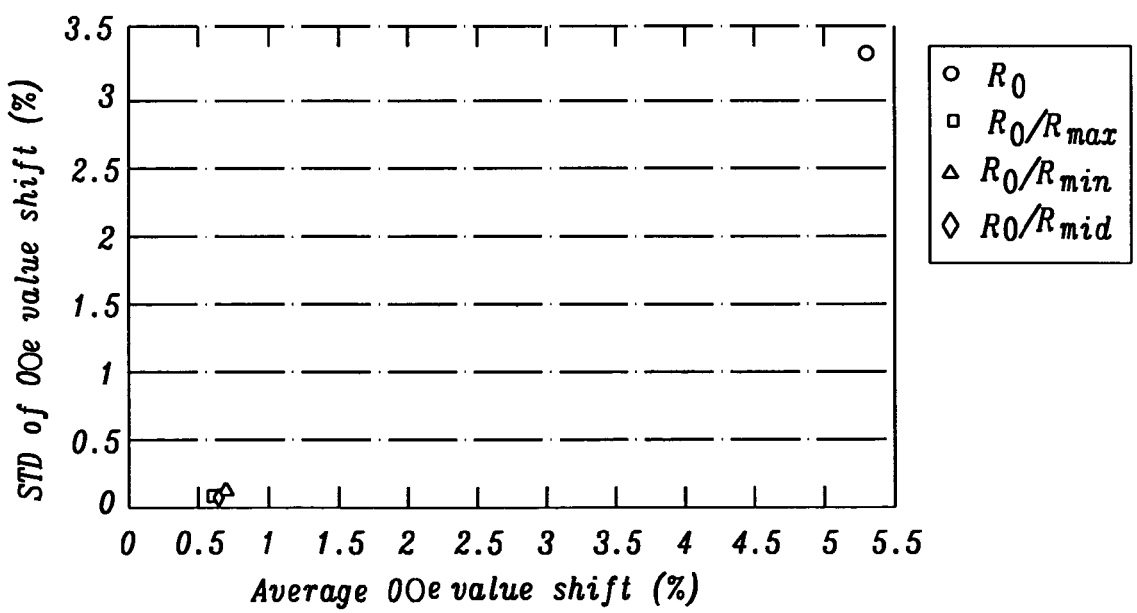
FIG. 4 illustrates how the normalization method reduces errors associated with aging effects.

FIG. 4 illustrates the effectiveness of resistance normalization for minimizing any stress induced resistance shifts. A total of 20 MTJ sensors were stressed with power-on and high temperature conditions for an extended period of time. The X axis in FIG. 4 represents the averaged zero field value (ZFV) shift of the population in percentage relative to the initial ZFV of the sensors. The Y axis is then the standard deviation (STD) of the ZFV shift as a percentage of the initial ZFV. The four different markers in FIG. 4 represent the ZFV shift STD vs. ZFV average shift values for sensor resistance without normalization (○), sensor resistance normalized to its maximum (□), minimal (Δ) or median (◇) values along the transfer curves of each sensor.

Without normalization, the average ZFV of the sensor shows an increase of ~5.2% relative to initial ZFV with an STD of the ZFV increase of ~3.2%. If sensor resistance is used as a direct measurement of the target magnetic field, the ZFV shift will present a maximum of 9~10% error for a close-loop sensor configuration and a maximum of also 10% error for an open-loop configuration. However, when the sensor resistance is normalized to the max/min/mean values along the transfer curves, the averaged shift in normalized ZFV is 0.7~0.8% with 0.1% STD. Thus the maximum error is ~0.3% for a close-loop and <1% for an open-loop sensor configuration. To apply this finding to actual measurements, we therefore use this normalization technique each time before measuring a set of external field values, thereby reducing the measurement error caused by resistance shift from long time operation and/or from external stresses.

To implement in-situ normalization during sensor operation, a magnetic field generation coil is inserted adjacent to the MR sensor. Before using the MR sensor to measure an external field, the necessary current is passed through the added coil to place the sensor in the selected determined state. In most cases the determined state that is selected will be the device's saturation state in which the sensor's resistance is a maximum or a minimum, depending on the direction of the saturating field.

In the curves shown in FIG. 3, the total field at the sensor should be beyond the +H or −H points. Additionally, once sensor resistance values in the saturated states, i.e. $R_{max}$ and $R_{min}$, have been stored, $R_{mean}$ can be calculated and stored. The added coil's field can then be turned off, leaving in place only the field that is to be measured and then normalized by means of the stored $R_{max}$, $R_{min}$ or $R_{mean}$ values.

Note that, in general, an effective normalization factor could be any linear combination of the $R_{max}$, and $R_{min}$ and that saturation is not necessarily the only possible determined state. Another example of a determined state would be the output at zero field i.e. the resistance half way up the resistance vs. applied field curve. Other examples include, but are not limited to, any magnetic field that can be precisely re-established at the MR sensor each time the latest normalization factor is to be computed.

In Summary:

Advantages of a magnetic sensor with resistance normalization for field sensing are
1. Significant reduction of error due to the baseline resistance shift
2. Normalized resistance shift and sensor-to-sensor variation is only affected by sensor asymmetry change and asymmetry dispersion
3. MR sensor, especially state-of-the-art TMR sensor, have much better uniformity and much less dispersion in its asymmetry than the resistance after long time stresses
4. Normalization method relieves the need of using MR sensors with same/similar resistance/sensitivity in close-loop field sensing schemes.

Normalization without the Need to First Establish a Base-Line

Figure 5A:
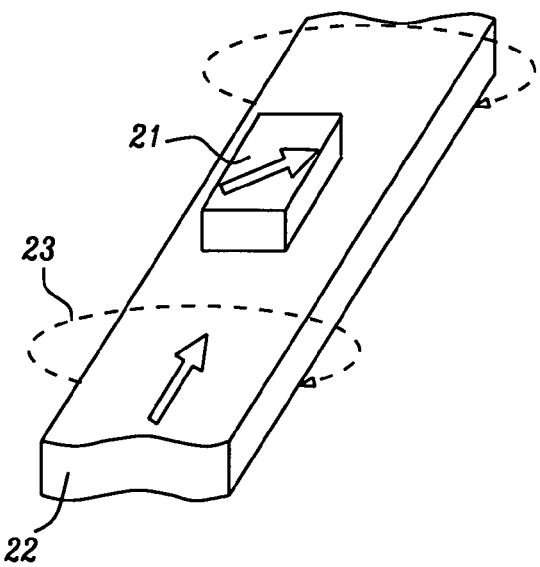
FIGS. 5a-5c illustrate one embodiment of the invention.

Referring now to FIG. 5A, the device includes at least one MR sensor 21 which undergoes a resistance change when a magnetic field causes the sensing layer magnetization in 21 to rotate. Electric circuit line 22 is positioned close to 21 and produces magnetic field 23 in 21 when an electric current flows through it. Magnetic field 23 is sufficient to magnetically saturate 21.

Figure 5B:
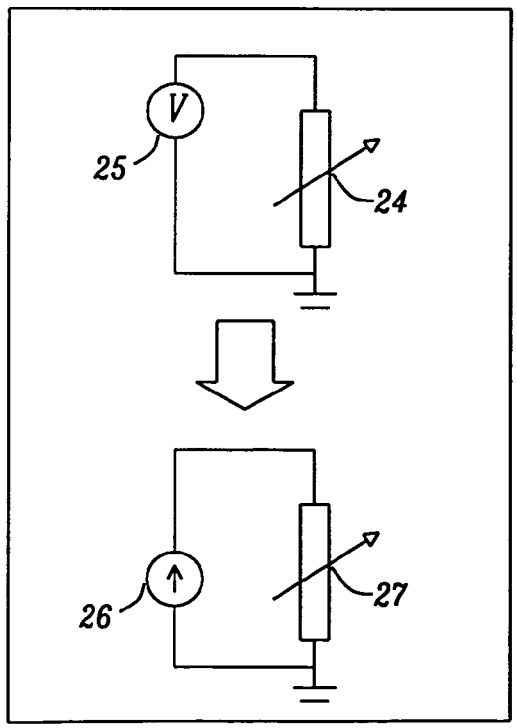
Figure 5C:
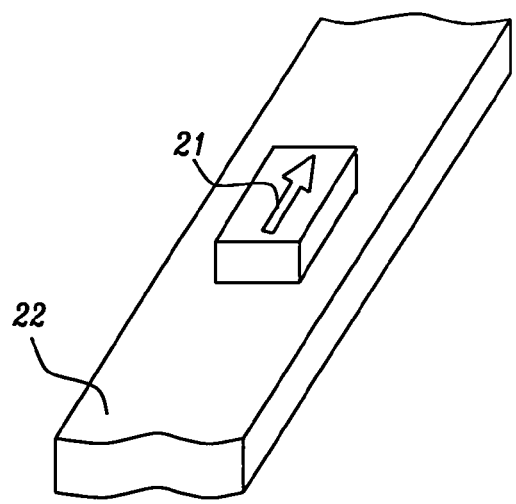

Normalization of the resistance of 21 to its maximum or minimum value is achieved by saturating MR sensor 21, using field 23, before measuring the unknown magnetic field at 21. First, an electric current is applied in 22 to generate magnetic field 23 in 21. Once MR sensor 21 saturates in either a high-resistance (HR) or low-resistance (LR) state 24 (FIG. 5B), fixed voltage source 25 is applied across sensor 21. Current source 26 then replaces the voltage source and is set to maintain the same current. Therefore, the current value of 26 is inversely proportional to the saturated state resistance 24, i.e. maximum or minimal resistance, of sensor 21 (as in FIG. 5C).

The current through 22 is then turned off thereby removing field 23 at 21 which now senses only the external field that is to be measured. With current source 26 sending current through 21, the voltage across sensor 21 becomes proportional to the resistance of 21 normalized to its saturated state resistance. Instead of a high field being used to achieve HR or LR saturation, known magnetic fields that are not strong enough to saturate 21, but that can be precisely reproduced, can also be used to calibrate normalized voltages of this type so that they can be utilized for measurement of the external field strength. Once the calibration has been done, it is permanent since the normalization factor can be rapidly measured each time it is felt that the MR sensor may have drifted since it last usage We note here that circuit line 22 is merely an example of a magnetic field generator; to implement the invention, any magnetic field generator, such as a coil or an external field source, could have been used.

SOME EXAMPLES (1) Example 1a

This example is based on the 'current source replacing voltage source' described immediately above where the normalizing factor is the sensor resistance in either the HR or LR state. The value of current source 26 is the current flowing through sensor 21 when voltage source 25 is applied while sensor 21 resistance is either the Hr or the LR resistance.

Example 1b

This example is based on the 'current source replacing voltage source' described immediately above except that the normalizing factor is calculated from the sensor resistance in both the HR and LR states. The value of current source 26 is calculated from these LR and HR currents so as to reflect the current flowing through sensor 21 when voltage source 25 is applied; sensor 21 resistance is then a linear function of both the HR and LR resistance such as, for example, but not limited to, the mean sensor resistance when voltage source 25 is present, i.e. the arithmetic average of the HR and LR resistances.

(2) Example 2

This example is the same as example 1b, except that magnetic field 23 (generated by 21) is pre-calibrated so that the specifics of particular magnetic environment 23, when produced by passing the same current in 22, are effectively identical. Also, when current in 22 is applied to generate field 23 in sensor 21, the external field is temporarily turned off or shielded out so that the field at 21 is 23 only. By applying voltage source 25, and later replacing it with current source 26 so that the same current flows through sensor 21 when voltage source 25 and field 23 are applied, normalization of sensor 21 resistance is by the resistance of the sensor in a particular magnetic environment 23. In this scheme, field 23 does not need to saturate sensor 21 but rather only needs good repeatability and stability.

(3) Example 3

This example is the same as example 1a, except that the normalization of the sensor resistance is not by the 'current source replacing voltage source' method described in Example 1A. Before measuring, when field 23 is on and sensor 21 is in state 24, adjustable current source 26 is used to send through sensor 21 electric current which is adjusted so that the voltage across 21 reaches and maintains a specific value during state 24. When field 23 is turned off (i.e. sensor 21 is in state 27 and senses only the external field), current from 26 is kept to be the same as when in state 24. For field sensing schemes that involve more than one MR sensor 21, the specific voltage value during the adjustment of 26 can be that associated with the state in which the voltages across all MR sensors were equal.

(4) Example 4

This example is the same as example 1b, except that the 'current source replacing the voltage source' method uses only adjustable current source 26 on sensor 21. During field 23 application, current source 26 is adjusted so that the voltage across sensor 21 is kept at a specific value. For field sensing schemes involving more than one MR sensor, the voltage measured after the adjustment of 26 (during normalizing) would be for the case when all voltages across the various MR sensors are equal.

(5) Example 5

This example is the same as example 2, except that the current source replacing voltage source method is changed to using only adjustable current source 26 on sensor 21. During field 23 application, current source 26 in adjusted so that the voltage across sensor 21 is kept at a specific value. For field sensing schemes involving more than one MR sensor, the specific voltage during adjustment of 26 can be that at which voltages across all MR sensors are equal.

(6) Example 6

This example is the same as example 1a, except that the normalization of the sensor resistance is not by the 'current source replacing voltage source' method described in example 1, but rather, measures and electronically stores a baseline resistance value for the sensor when in the HR or LR states, either directly (sensor 21 resistance value) or indirectly (voltage or current across sensor 21). The recorded/delayed/stored resistance data are utilized later to normalize the sensor resistance by using other digital or analog circuitry (in this case to perform a division operation).

(7) Example 7

This example is the same as example 1b except that the resistance value of the sensor, when in the HR and in the LR state, is stored. These resistance values are then combined in a linear operation to generate a value that can be used to normalize the sensor resistance. Said linear operation could be, but is not limited to, averaging the HR and LR resistance values.

(8) Example 8

This example is the same as example 2 except that the normalization of the sensor resistance is not by the 'current source replacing voltage source' method described in Example 1C, but rather through certain digital or analog circuitry that can record/delay/store the resistance value of the sensor when field 23 is applied, either directly (sensor 21 resistance value) or indirectly (voltage or current across sensor 21). The recorded/delayed/stored resistance data are then later used to normalize the sensor resistance through other digital or analog circuitry, i.e. a division operation.

What is claimed is:

1. A method to correct for aging effects in a magneto-resistive (MR) sensor having an output, comprising:
    placing said MR sensor in a determined state by exposing said MR sensor to a particular magnetic environment, a determined state being a state of said MR sensor that is associated with a first output value of the MR sensor, when the sensor is in said particular magnetic environment, that changes in a predictable manner as said MR sensor ages;
    exposing the sensor to an unknown magnetic field thereby obtaining a second value for said output; and
    then correcting said second output value through application of a normalizing factor that adjusts the second output value relative to said first output value.

2. The method recited in claim 1 further comprising:
    recording said sensor's resistance, while said sensor is in said determined state, as a baseline value that is also said first output value($R_{1a}$);
    then, prior to using said sensor to measure an unknown magnetic field, measuring said sensor's resistance ($R_{1b}$) while said sensor is in said determined state;
    then computing said normalizing factor as $R_{1b}/R_{1a}$; and
    then applying said normalization factor to measuring said unknown magnetic field.

3. The method recited in claim 1 further comprising:
    while said sensor is in said determined state, applying a voltage $V_1$ across said sensor whereby a current $I_1$ passes through said sensor;
    computing and then storing a value for sensor resistance $R_1$ ($V_1$ divided by $I_1$);
    then, through use of a current source, while said sensor is in said unknown magnetic field, forcing a current of magnitude $I_1$ through said sensor thereby generating across said sensor a voltage drop $V_2$ which is a normalized voltage output for said sensor; and
    then, from $R_1$ times $V_2$ divided by $V_1$, computing a normalized resistance value $R_2$, for said sensor when said sensor is in said unknown field.

4. The method recited in claim 1 wherein said particular magnetic environment is a magnetic field of sufficient intensity to magnetically saturate said MR sensor.

5. The method of claim 4 wherein said output of the MR sensor when the MR sensor is in said particular magnetic environment is selected from the group consisting of maximum sensor resistance ($R_{max}$), minimum sensor resistance ($R_{min}$), and any linear combination of $R_{max}$ and $R_{min}$, including averaging, adding, subtracting, multiplying, and dividing.

6. The method recited in claim 1 wherein said particular magnetic environment is generated using a conductive line or coil that is fixed in place relative to said MR sensor.

7. The method of claim 6 wherein said particular magnetic environment is a uniform magnetic field of insufficient intensity to magnetically saturate said MR sensor, said particular magnetic environment being reproduced by passing a current through said conductive line or coil.

8. The method recited in claim 1 wherein said particular magnetic environment is generated by an external source that is not fixed in place relative to said MR sensor.

9. The method recited in claim 1 wherein said MR sensor is selected from the group consisting of AMR (anisotropic magneto-resistance), CIP GMR (Current In Plane Giant Magneto-Resistance), CPP (Current Perpendicular to Plane) GMR, and TMR (Tunneling Magneto Resistance) devices.

10. A method to measure a first electric current that is passing through a first conductive line, comprising:
    providing a magneto-resistive (MR) sensor having an output;
    placing said MR sensor in a determined state by exposing said MR sensor to a particular magnetic environment, a determined state being a state of said MR sensor that is known to change in a predictable manner as said MR sensor ages and that is associated with said output when the sensor is in said particular magnetic environment;
    providing a second conductive line and placing said MR sensor at a location between said first and second conductive lines at a known distance from each;
    passing a second electric current through said second conductive line in a direction such that magnetic fields associated with said first and second electric currents oppose one another;
    obtaining an updated value for said MR sensor's output by application of a normalizing factor to said output, thereby creating a normalized output;
    then adjusting said second electric current until said normalized output reaches said determined state; and
    then deriving a value for said first electric current from that of said second electric current.

11. The method recited in claim 10 further comprising:
    recording a baseline value for said normalized output the first time the sensor is placed in said determined state;
    applying said normalizing factor to said output to obtain an updated normalized output value of said MR sensor and then subtracting said baseline value from said updated normalized output value thereby generating a difference; and
    adjusting said second current until said difference is about zero, thereby indicating that said MR sensor has reached said determined state.

12. The method recited in claim 10 further comprising:
    while said sensor is in said determined state, applying a voltage $V_1$ across said sensor whereby a current $I_1$ passes through said sensor; and
    then, when said sensor is in an unknown magnetic field that causes said sensor to have resistance value $R_2$, through use of a current source, passing said current $I_1$ through said sensor thereby generating across said sensor a voltage $V_2$ whose value equals $I_1 \times R_2$.

13. The method recited in claim 10 wherein said particular magnetic environment is a magnetic field of sufficient intensity to magnetically saturate said MR sensor.

14. The method of claim 10 wherein said output of the MR sensor when the MR sensor is in said particular magnetic environment is selected from the group consisting of maximum sensor resistance ($R_{max}$), minimum sensor resistance ($R_{min}$), and any linear combination of $R_{max}$ and $R_{min}$, including averaging, adding, subtracting, multiplying, and dividing.

15. The method of claim 10 wherein said particular magnetic environment is a magnetic field of insufficient intensity to magnetically saturate said MR sensor, said particular magnetic environment being reproducibly generated by a conductive line or coil that is fixed in place relative to said MR sensor and by passing a current through said conductive line or coil.

* * * * *